United States Patent
Pohlmann et al.

(10) Patent No.: US 10,884,034 B2
(45) Date of Patent: Jan. 5, 2021

(54) CURRENT MEASUREMENT CIRCUIT

(71) Applicant: Delta Electronics (Thailand) Public Co., Ltd., Samutprakarn (TH)

(72) Inventors: Robert Pohlmann, Hamm (DE); Frank Schafmeister, Warburg (DE); Rongyuan Li, Paderborn (DE)

(73) Assignee: DELTA ELECTRONICS (THAILAND) PUBLIC CO., LTD., Samutprakarn (TH)

( * ) Notice: Subject to any disclaimer, the term of this patent is extended or adjusted under 35 U.S.C. 154(b) by 75 days.

(21) Appl. No.: 16/181,834

(22) Filed: Nov. 6, 2018

(65) Prior Publication Data
US 2019/0146014 A1  May 16, 2019

(30) Foreign Application Priority Data
Nov. 14, 2017 (EP) .................... 17201666

(51) Int. Cl.
*G01R 19/14* (2006.01)
*H02M 7/219* (2006.01)
*H02M 1/32* (2007.01)
*H02M 1/42* (2007.01)
(Continued)

(52) U.S. Cl.
CPC ............. *G01R 19/14* (2013.01); *G01R 15/18* (2013.01); *H02M 1/32* (2013.01); *H02M 1/42* (2013.01); *H02M 1/4233* (2013.01); *H02M 7/219* (2013.01); *H02M 2001/0009* (2013.01)

(58) Field of Classification Search
CPC ........ H02M 1/32; H02M 1/4233; G01R 15/18
See application file for complete search history.

(56) References Cited

U.S. PATENT DOCUMENTS

| 2006/0158166 | A1  | 7/2006 | Van Der Wal |
| 2010/0085785 | A1* | 4/2010 | Dommaschk ........... H02M 7/49 363/54 |

(Continued)

FOREIGN PATENT DOCUMENTS

| EP | 2 921 866 A2 | 9/2015 |
| EP | 3 043 460 A1 | 7/2016 |

OTHER PUBLICATIONS

European Search report dated Apr. 24, 2018.
European Search Report dated Jun. 30, 2020, 7 pages.

*Primary Examiner* — Alvaro E Fortich
(74) *Attorney, Agent, or Firm* — Vector IP Law Group LLC; Robert S. Babayi

(57) ABSTRACT

According to the invention, a current measurement circuit for providing a measurement signal for a controller for controlling a switching of power switches of a power converter comprises a first current sensing circuit for sensing a first bidirectional current representative of a current through a first power switch of the power converter. The first current sensing circuit is being adapted to provide a first sensing signal indicative of the first bidirectional current. The current measurement circuit further comprises a second current sensing circuit for sensing a second bidirectional current representative of a current through a second power switch of the power converter. The second current sensing circuit is adapted to provide a second sensing signal indicative of the second bidirectional current.

19 Claims, 4 Drawing Sheets

(51) Int. Cl.
*G01R 15/18* (2006.01)
*H02M 1/00* (2006.01)

(56) References Cited

U.S. PATENT DOCUMENTS

| | | | |
|---|---|---|---|
| 2011/0075462 A1* | 3/2011 | Wildash | H02M 1/4208 |
| | | | 363/127 |
| 2014/0002033 A1 | 1/2014 | Chen et al. | |
| 2015/0138850 A1* | 5/2015 | Pan | H02M 1/4208 |
| | | | 363/37 |
| 2016/0028304 A1 | 1/2016 | O'Day | |
| 2016/0134185 A1 | 5/2016 | Wang et al. | |
| 2016/0190948 A1* | 6/2016 | Yang | H02M 3/33592 |
| | | | 363/21.14 |
| 2016/0373018 A1* | 12/2016 | Burgermeister | H02P 27/04 |

* cited by examiner

CURRENT MEASUREMENT CIRCUIT

TECHNICAL FIELD

The invention relates to a current measurement circuit for providing a measurement signal for a controller for controlling a switching of power switches of a power converter comprises a first current sensing circuit for sensing a first bidirectional current representative of a current through a first power switch of the power converter. The first current sensing circuit is being adapted to provide a first sensing signal indicative of the first bidirectional current. The current measurement circuit further comprises a second current sensing circuit for sensing a second bidirectional current representative of a current through a second power switch of the power converter. The second current sensing circuit is adapted to provide a second sensing signal indicative of the second bidirectional current. In addition, the current measurement circuit comprises a switching circuit being adapted to provide a first measurement signal based on the first sensing signal, the second sensing signal and a polarity signal representative of a polarity of an input voltage of the power converter.

In addition, the invention relates to a method for providing a measurement signal for a controller for controlling a switching of power switches of a power converter. The method comprises the following steps:

a) providing a first sensing signal by sensing a first bidirectional current representative of a current through a first power switch of the power converter;
b) providing a second sensing signal by sensing a second bidirectional current representative of a current through a second power switch of the power converter; and
c) providing a first measurement signal based on the first sensing signal, the second sensing signal and a polarity signal representative of a polarity of an input voltage of the power converter.

Further, the invention relates to a power converter and a control arrangement therefor, both comprising said current measurement circuit.

BACKGROUND ART

Circuits for current measurement are widely used in power converters. Typically, current measurements are used to control power converters and to ensure reliable operations, for example through an over-current protection.

Recent trends in the development of power converters impose new requirements on current measurements. For example, one trend in power converter development is zero-voltage switching. Zero-voltage switching is believed to increase the efficiency of a power converter due to reduced switching losses of the power switches. Further, zero voltage switching allows for increased switching frequencies without unduly compromising on the efficiency. Increased switching frequencies in turn allow for smaller and more cost effective inductors of the power converter. However, the higher the switching frequency, the more sophisticated becomes a precise real time measurement of the current through the power converter's inductors and/or power switches. Therefore, in some power converters, as for example in power factor correctors (PFC) with triangular current mode (TCM), a current measurement is used to only detect the zero-crossing of the inductor current which in turn is used to control zero-voltage switching of a power switch of the power converter. This imposes restrictions with respect to over-current protection and the accuracy of a current control of such converters having open loop current control. In general, zero crossing detection does not allow for closed loop current control, but only open loop current control. A real magnitude current measurement enables closed loop current control which facilitates a higher quality mains current waveform, especially under power line disturbance situations. This is a key performance criterion for PFCs.

US 2016/0134185 A1 (ZTE Corporation, China) discloses a current zero-cross detection device for a totem pole bridgeless power converter. The current zero-cross detection device comprises a current transformer and switches controlled such as to store energy in the current transformer. This energy is released upon the zero-crossing of the current through a power switch. The released energy is used to detect a zero-crossing of the current through the power switch. While the current zero-cross detection device outputs a signal indicating the zero-crossing of the current through the power switch, the current zero-cross device is not intended to measure the real magnitude of the current through the power switch, especially not while said current is increasing and approaching it's maximum value. Therefore, an over-current protection is not possible. EP 3 043 460 A1 (ZTE Corporation, China) discloses a totem-pole bridgeless power factor correction (PFC) soft switch control device. A voltage detection module comprises two auxiliary windings added to the PFC-inductor, with each auxiliary winding feeding a voltage divider and two voltage clamping diodes. The voltage detection module is used to detect the voltage across the PFC inductor during the positive and negative half cycle of the AC input voltage. However, the detected voltage is kept in a predetermined range and suitable for detecting the zero-crossing of the current through the PFC-inductor, only. The voltage detection module is not capable of measuring the exact value of the current through the PFC-inductor, nor the current through any power switch.

US 2014/0002033 A1 (Huawei Technologies Co., Ltd., China) discloses a bridgeless power factor correction (PFC) circuit comprising a control unit having a current sampling component which samples the current through the power switches and includes a current transformer and a resistor. The control unit further comprises a triangular current mode (TCM) controller which controls on/off of the power switches according to directions and values of currents in the current sample information, so as to finally implement soft switching of the power switches. In particular, when the TCM controller detects that the current of the inductor drops to a certain negative current, the TCM controller turns off the power switch, which is for example a MOSFET, such that the current does not flow through the body diode of the MOSFET and, thereby, reducing the loss caused by a reverse recovery current of the body diode of the MOSFET. However, current sampling becomes impractical for high switching frequencies.

The prior art does not provide a current measurement suitable for a precise and real-time control of a power converter, as well as suitable for providing a real-time over-current protection, both even at high switching frequencies as desired, for example, in zero-voltage switching power converters.

SUMMARY OF THE INVENTION

It is the object of the invention to create a current measurement pertaining to the technical field initially mentioned, overcoming the disadvantages of the prior art or at least partly overcoming the disadvantages of the prior art. In particular, it is an object of the invention to provide a current measurement suitable for a precise and real-time control of a power converter, as well as suitable for providing a real-time over-current protection, both even at high switching frequencies as desired, for example, in zero-voltage switching power converters.

The solution of the invention is specified by the features of claim 1. The invention deals with a current measurement circuit for providing a measurement signal for a controller for controlling a switching of power switches of a power converter comprises a first current sensing circuit for sensing a first bidirectional current representative of a current through a first power switch of the power converter. The first current sensing circuit is being adapted to provide a first sensing signal indicative of the first bidirectional current. The current measurement circuit further comprises a second current sensing circuit for sensing a second bidirectional current representative of a current through a second power switch of the power converter. The second current sensing circuit is adapted to provide a second sensing signal indicative of the second bidirectional current. In addition, the current measurement circuit comprises a switching circuit being adapted to provide a first measurement signal based on the first sensing signal, the second sensing signal and a polarity signal representative of a polarity of an input voltage of the power converter. According to the invention, the first measurement signal is indicative of the first bidirectional current during a first time interval and indicative of the second bidirectional current during a third time interval.

A bidirectional current is a current which can flow in two directions, i.e. in a first direction and in a second direction opposite to the first direction, for example through a power switch of a converter. At a time, the bidirectional current can flow only in one direction. Over the time, the bidirectional current can change its direction.

A power switch can be any semiconductor switch. For example, the power switch can be any transistor such as a bipolar transistor, an insulated gate bipolar transistor (IGBT) or a unipolar transistor. In particular, the transistor can be a field effect transistor (FET), more particularly a metal oxide semiconductor field effect transistor (MOSFET), and most particularly a transistor with integrated diode. A bidirectional current can, for example flow in a first direction from the drain terminal of a FET or MOSFET to the source terminal of the FET or MOSFET transistor, and in a second direction from the source terminal to the drain terminal of a FET or MOSFET. In case of a transistor with integrated diode, a bidirectional current can, for example, flow through the actual transistor in a first direction, and through the diode when having a second direction.

A current representative of a current through a power switch may be any current which at least intermittently equals the current through a power switch. Such a current can be, for example, a current through an inductor which thereafter intermittently flows through the power switch.

The expression "X is indicative of Y" means that there is a one-to-one relation between X and Y. Examples for such a one-to-one relation may include but are not limited to: linear relation, exponential relation, logarithmic relation, quadratic relation or square root relation. Typical examples may further include characteristic curves of sensors, for example current sensors or magnetic field sensors. Examples for relations which are not one-to-one relations may include relations like "X equals the sign of Y", i.e. X equals one for any positive Y and X equals minus one for any negative Y, because for one X there exist more than one (in this example: infinite) values of Y.

The expression "X based on Y" means that X is any function of Y. The expression "X based on Y and Z" means that X is any function of Y and of Z.

A signal representative of a polarity of an input voltage of the power converter can be a signal having a first value for each positive input voltage of the power converter and a second value for each negative input voltage of the power converter. The first value and the second value are different. For example, the first value can be a voltage level suitable to turn on a power switch, particularly a transistor. The second value can be a voltage level suitable to turn off a power switch, in particular a transistor. An inversion of the first value leads to the second value, and vice versa.

According to the invention, the current measurement circuit provides a measurement signal which is indicative of bidirectional currents. Advantageously, this measurement signal can be used for over-current protection. Further, the measurement signal can be used for a precise control of the power converter, in particular for a precise closed loop current control of the converter. Also, the current measurement signal can be used for a control of the switching of the power switches of a power converter.

As there are, according to the invention, two independent current sensing circuits, each of them can be designed differently, for example with respect to the measuring range. This allows for sensing signals with similar signal levels even if the bidirectional currents have very different values, or are even different by magnitudes of order.

A further advantage is that the current sensing circuits can flexibly be placed at different positions in the power converter. On one hand they can be connected in series with the respective power switch. In this case it doesn't matter at which side of the power switch the current sensing circuit is placed. On the other hand, the current sensing circuit can be positioned for example in series with an inductor which carries intermittently the current of the respective power switch. In this case it doesn't matter at which side of the inductor the current sensing circuit is placed.

In another embodiment, both sensing signals of the measurement circuit are galvanically isolated from the power switches. In particular, the current sensing circuits are current transformers. Each current transformer may have a primary winding and a secondary winding. Each primary winding is designed for conducting a bidirectional current. Most particularly, each primary winding is connected in series with a power switch of the power converter. Each secondary winding of the current transformer is designed for delivering a sensing signal.

Galvanically isolated sensing signals allow for a current measurement circuit galvanically isolated from the power switches. Therefore, the measurement circuit can be used to measure currents at galvanically different potentials, i.e. to measure the current of power switches connected, for example, in totem pole configuration. A galvanic isolation further increases the safety of the measurement circuit as a contact of a human being with the measurement circuit does not impose any danger to said human being, as opposed to a contact with a power switch of the power converter which can be potentially fatal.

A use of current transformers is advantageous as they are commercially available in a vast variety. Additionally, when placed in series with a power switch, a small shape current transformer might be sufficient without the risk of saturation of the current transformer.

When connecting a current transformer in series with a power switch, the connection can be at either contact terminal of the power switch. If the power switch is a FET, the current transformer can be connected to the drain terminal of the FET or to the source terminal of the FET.

When connecting a current transformer in series with the inductor, saturation of the current transformer can be avoided by generating a distinct discontinuous current mode (DCM) in the inductor.

Another advantage is that a current transformer can be easily adapted for the magnitude of current to be measured, especially if the bidirectional currents have different magnitudes but the sensing signals are desired to have similar signal levels for different bidirectional currents.

In addition, the output current of the current transformer can be connected to a shunt resistor to produce a voltage signal across the shunt resistor which is proportional to the output current of the current transformer. Thereby, a galvanically isolated voltage signal can be used for the measurement of a current.

Besides galvanically isolated sensing signals, it is also possible to use galvanically coupled, i.e. galvanically non-isolated sensing signals. Such a sensing signal could be provided by a shunt resistor connected directly in series with the power switch without the use of a current transformer, for example. Although the shunt resistor offers a simple and accurate way to provide a sensing signal, a galvanic isolation might be needed anyway, in particular if different shunt resistors do not have a common galvanic potential.

In addition to current transformers, there are known a plurality of different current sensing techniques with galvanic isolation. For example, there are known magnetic field sensors like Hall-effect sensors, flux gate sensors and magneto resistive sensors. However, as already mentioned, a current transformer is considered to be most advantageous.

In another embodiment, the first measurement signal is proportional to the first bidirectional current during the first time interval and proportional to the second bidirectional current during the second time interval.

The advantage thereof is that the controller for controlling a switching of power switches of a power converter can simply determine the actual current value of the current to be measured.

Instead of the first measurement signal being proportional to the bidirectional currents during time intervals, there could be any other one-to-one relation between the two signals. Examples thereof have been mentioned already.

There is still another embodiment of the current measurement circuit. If the polarity signal has a first value, the switching circuit is adapted to start the first time interval when the first bidirectional current has a zero-crossing and to end the first time interval when the first power switch is turned off. If the polarity signal has a second value, the switching circuit is adapted to start the third time interval when the second bidirectional current has a zero-crossing and to end the third time interval when the second power switch is turned off.

A zero crossing of the bidirectional current is a change of the direction of the bidirectional current with an infinitesimal time while the value of the current is zero. An example of a zero-crossing of the bidirectional current is a linearly decreasing bidirectional current, which reaches zero and, without remaining any definite time at zero value, continues to increase in the opposite direction. Any time-curve of the bidirectional current with the derivative thereof being unequal to zero when the bidirectional current becomes zero and changes the direction, is considered to have a zero-crossing. Typical cases which are not considered to be a zero-crossing are, for example, if the bidirectional current is shut off, i.e. falls to zero and remains there for a certain period of time, before the bidirectional current starts to flow in the opposite direction. Or in other words, the zero-crossing of the bidirectional current occurs at a specific moment of time but not during a period of time.

Time intervals are periods of time within a switching cycle of a power switch of the power converter. Thus, time intervals according to the invention are shorter than a complete switching cycle of the power switch. For example, the switching frequency of the power switches can be in the range of 15 KHz to 300 KHz, preferably 50 KHz or more, in particular 100 KHz or more and most particularly 150 KHz or more. Therefore, the time intervals are shorter than 20 μs, in particular shorter than 10 μs, and most particularly shorter than 6.667 μs. Especially when using wide bandgap power switches, such as for example GaN or SiC semiconductor switches, the switching frequency of said power switches can be even higher, as for example up to 500 KHz or even up to 1 MHz.

By choosing the time intervals according to the invention, the maximum bidirectional current can always be within the time interval. If the time intervals were be chosen differently, the maximum bidirectional current might not occur within the time intervals. This could endanger the over-current protection.

Instead of having a first value or a second value, the polarity signal can also have a first value range or a second value range with each value range being representative of a polarity of an input voltage of the power converter. In any case, the polarity signal can be adapted to control a switch, in particular a transistor. For example, the first value or the first value range of the polarity signal can be suitable to turn on a switch, in particular a transistor, and the second value or the second value range of the polarity signal can be suitable to turn off a switch, in particular a transistor. The value or value ranges of the polarity signal can further be suitable to be inverted, i.e. if the polarity signal having a first value or a first value range is connected to the input of an inverter, for example a logical inverter, the inverter will provide an output corresponding to the second value or the second value range of the polarity signal, and vice versa.

In another embodiment, the switching circuit is adapted to provide a second measurement signal based on the first sensing signal, the second sensing signal and the polarity signal representative of the polarity of the input voltage of the power converter. The second measurement signal is indicative of the second bidirectional current during a second time interval and indicative of the first bidirectional current during a fourth time interval.

The second measurement signal can be indicative of the first bidirectional current while the latter having the opposite direction compared to the direction of the first bidirectional current when the first measurement signal is indicative of the first bidirectional current. The same applies for the second bidirectional current. Therefore, depending on the direction of the first or second bidirectional current, either the first or the second measurement signal can be indicative of the first or second bidirectional current, respectively.

With only one measurement signal, the maximum value of only one direction of a bidirectional current can be measured. As the maximum values of the bidirectional current can be very different, one measurement signal might be sufficient for such applications. However, for best accuracy, two measurement signals are preferred. Depending on the specific application and/or the specific power converter, there could be also three or even more measurement signals, as for example four, eight or twelve. In this case, a third sensing signal and a third current sensing circuit might be required, or even more, as for example in total four, eight or twelve sensing signals and in total four, eight or twelve sensing circuits. Specific power converters can be, for example, power converters with multiple PFC-rails in parallel, in particular with four rails or even six rails.

In another embodiment, the second measurement signal is proportional to the second bidirectional current during a second time interval and proportional to the first bidirectional current during a fourth time interval.

As already mentioned in the context of the first measurement signal, the advantage of the above feature is again that the controller for controlling a switching of power switches of a power converter can simply determine the actual current value of the current to be measured.

Instead of the second measurement signal being proportional to the bidirectional currents during time intervals, there could be any other one-to-one relation between the two signals.

There is still another embodiment of the current measurement circuit. If the polarity signal has a first value, the switching circuit is adapted to start the second time interval when the second bidirectional current has a zero-crossing and to end the second time interval when the second power switch is turned off. If the polarity signal has a second value, the switching circuit is adapted to start the fourth time interval when the first bidirectional current has a zero-crossing and to end the fourth time interval when the first power switch is turned off.

As the first time interval and the second time interval are within one and the same switching cycle of the power switch of the power converter, the duration of the first time interval and the second time interval together is shorter than the duration of a switching cycle of the power switch. The same applies for the third and fourth time interval. Therefore, the duration of the third time interval and the fourth time interval together is shorter than the duration of a switching cycle of the power switch.

Again, by choosing the time intervals according to the invention, the maximum bidirectional current can always be within the time interval. If the time intervals were be chosen differently, the maximum bidirectional current might not occur within the time intervals. This could endanger the over-current protection.

Also, instead of having a first value or a second value, the polarity signal can have a first value range or a second value range which each value range being representative of a polarity of an input voltage of the power converter. For these values and value ranges, here the same applies as mentioned earlier.

In another embodiment, each measurement signal is a unidirectional signal.

A unidirectional signal includes also a unipolar signal, if applicable. A unidirectional signal can be a current having always one and the same direction. A unipolar signal can be a voltage always having one and the same polarity.

The advantage of unidirectional measurement signals is that they are simply processable by a controller for controlling a switching of power switches of a power converter. Especially digital signal processors (DSP) with a built-in analog-digital converter (ADC) can use each unidirectional and/or unipolar measurement signal devoid of any level shifting.

The measurement signal could also be bidirectional or bipolar. However, in this case the measurement signal is not suitable for direct use by an ADC but requires, for example, a level shifting which makes the current measurement circuit more complex.

In another embodiment, each measurement signal is an analog signal.

An analog signal is well suited for further processing in analog controllers or in digital controllers as mentioned above.

Analog measurement signals provide a very good resolution and can be very fast, i.e. they are well suited for fast switching power converters like zero-voltage switching power converters having high switching frequencies in the range of 15 KHz to 300 KHz, as for example more than 50 KHz, or more than 100 KHz, or even more than 150 KHz. Analog measurement signals can be used for even higher switching frequencies, as for example for frequencies up to 500 KHz or even up to 1 MHz.

Further, the current measurement circuit can be realized in simple analog technique devoid of digital signal processing (DSP) or any other programmable hardware or any software.

Each measurement signal could also be a digital signal. However, in this case the current measurement circuit might require an ADC and the measurement signal might be limited with respect to the maximum frequency thereof, and with respect to the maximum resolution thereof.

In another embodiment, the current measurement circuit is further comprising a shunt resistor per measurement signal. Each measurement signal corresponds to a voltage across the respective shunt resistor.

For example, if each sensing signal is an electrical current, each sensing signal can be converted into a voltage by directing each sensing signal through a shunt resistor. The measurement signal can be formed by the voltage across the shunt resistor. The shunt resistor further has the advantage that by proper dimensioning of the shunt resistor, i.e. by selecting the ohmic value, the desired voltage range of the measurement signal can be adjusted for independently of the sensing signal.

Without a shunt resistor per each measurement signal, each measurement signal can be a current. The processing of such a current might be more difficult for a subsequent controller than the processing of a measurement signal being a voltage.

Instead of a shunt resistor, the measurement circuit can comprise, for example, a voltage divider. A voltage divider might be advantageous for sensing signals having large values. On the other hand, a voltage divider is more complex than a shunt resistor.

In another embodiment, the switching circuit comprises switches only, in particular diodes and transistors only, most particularly the transistors are field effect transistors.

The diodes can be conventional diodes, Shottky-diodes or z-diodes.

An advantage of such a switching circuit is that it can direct each sensing signal, even if being bidirectional or bipolar, such that an unidirectional or unipolar measurement signal is provided.

A further advantage is that the only input signal of the switching circuit, besides the sensing signals, is the polarity signal of an input voltage of the power converter.

Instead of comprising switches only, in particular discrete switches, the switching circuit can be a multiplexer, a logic array, or a combination thereof. However, such multiplexers, logic arrays, or combinations thereof might not be suitable to handle bipolar and/or bidirectional sensing signals.

According to another aspect of the invention, a control arrangement for a power converter comprises a current measurement circuit according to the invention and a controller. In particular, the control arrangement comprises a power factor controller. More particularly, the control arrangement comprises a triangular current mode power factor controller.

The control arrangement further may comprise a controller such as a digital signal processor (DSP). The DSP may comprise one or more on-chip comparators and one or more analog digital converters (ADC). Due to the fact that each measurement signal can be unidirectional or unipolar, a reconfiguration of the ADC might not be required. This is an important advantage because otherwise the reconfiguration of the ADC had to be done synchronously with the switching frequency of the power switches which can be in the range of 15 KHz to 300 KHz, for example with 50 KHz or more, 100 KHz or more, or with 150 KHz or more, which would impose a significant burden on the controller, or is practically impossible. The burden would be even more significant when using wide bandgap power switches, such as for example GaN or SiC semiconductor switches, with switching frequencies of, for example, up to 500 KHz or even up to 1 MHz.

The control arrangement according to the invention can combine the advantages of the prior art, as for example using comparators for zero-current detection, and in addition it is suitable to perform a fast over-current protection as well as precise current control via the ADC.

According to another aspect of the invention, a power converter comprises a current measurement circuit according to the invention. In particular, the power converter is an AC-DC converter. More particularly, the power converter is a bridgeless totem pole power converter with triangular current mode power factor controller.

The power converter may also comprise interleaved topologies, for example interleaved PFC modules. A PFC module may comprise an inductor and a totem pole power switch arrangement. Therefore, an interleaved PFC power converter might have a plurality of inductors and totem pole power switches.

An advantage of the power converter according to the invention is that even if the input voltage of the power converter, for example the line voltage, is distorted, the power converter is suitable to perform a fast over-current protection as well as a precise current control via the ADC. However, in case an over current occurs and a fast over-current protection has to be performed during a usually short period of time, the precise current control might be inactive.

Instead of an AC-DC converter, any AC-AC converter can be used, for example. Advantages and disadvantages depend on the specific application.

Instead of bridgeless power converters, power converter with a rectifier bridge can be used. The efficiency of such converters is disadvantageous.

Instead of a triangular current mode power factor controller, any other power factor controller might be used, for example such as a discontinuous current mode power factor controller. However, zero voltage switching is more difficult in this case.

According to another aspect of the invention, a method provides a measurement signal for a controller for controlling a switching of power switches of a power converter. The method comprises the following steps:

d) providing a first sensing signal by sensing a first bidirectional current representative of a current through a first power switch of the power converter;

e) providing a second sensing signal by sensing a second bidirectional current representative of a current through a second power switch of the power converter; and f) providing a first measurement signal based on the first sensing signal, the second sensing signal and a polarity signal representative of a polarity of an input voltage of the power converter.

According to the invention, the method is characterized in that g) the first measurement signal is indicative of the first bidirectional current during a first time interval and indicative of the second bidirectional current during a third time interval.

The method provides a measurement signal which is indicative of bidirectional currents. Advantageously, this measurement signal can be used for over-current protection. Further, the measurement signal can be used for a precise control of the power converter. Also, the current measurement signal can be used for a control of the switching of the power switches of a power converter.

As there are, according to the invention, two independent sensing signals, each of them can be designed differently, for example with respect to the measuring range. This allows for a measuring signal with similar signal levels even if the bidirectional currents have very different values, or are even different by magnitudes of order.

In another embodiment, the method further comprises the step of providing a second measurement signal based on the first sensing signal, the second sensing signal and the polarity signal representative of the polarity of the input voltage of the power converter. The second measurement signal is indicative of the second bidirectional current during a second time interval and indicative of the first bidirectional current during a fourth time interval.

The second measurement signal can be indicative of the first bidirectional current while the latter having the opposite direction compared to the direction of the first bidirectional current when the first measurement signal is indicative of the first bidirectional current. The same applies for the second bidirectional current. Therefore, depending on the direction of the first or second bidirectional current, either the first or the second measurement signal can be indicative of the first or second bidirectional current, respectively.

As mentioned already, with only one measurement signal, the maximum value of only one direction of a bidirectional current can be measured. As the maximum values of the bidirectional current can be very different, one measurement signal might be sufficient for such applications. However, for best accuracy, two measurement signals are preferred. Depending on the specific application, there could be also three measurement signals. In this case, a third sensing signal and a third current sensing circuit might be required.

Other advantageous embodiments and combinations of features come out from the detailed description below and the totality of the claims.

BRIEF DESCRIPTION OF THE DRAWINGS

The drawings used to explain the embodiments show.

In the figures, the same components are given the same reference symbols.

PREFERRED EMBODIMENTS

Figure 1:
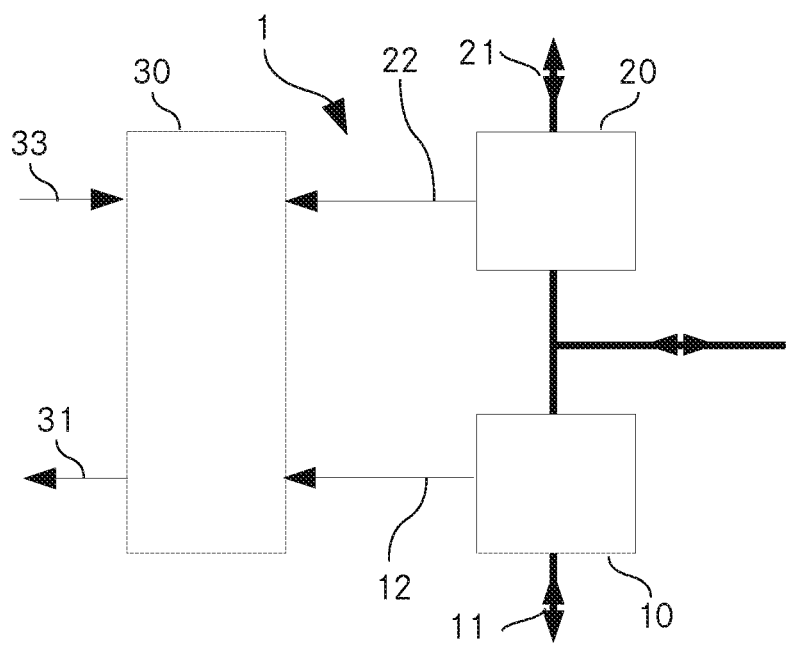
FIG. 1 a block diagram of a first embodiment of the invention.

FIG. 1 shows a block diagram of a first embodiment of the invention. A current measurement circuit 1 comprises a first current sensing circuit 10 and a second current sensing circuit 20. The first current sensing circuit 10 senses a first bidirectional current 11 of a power converter (not shown in FIG. 1) and the second current sensing circuit 20 senses a second bidirectional current 21 of the power converter. The first bidirectional current 11 and the second bidirectional current 21 may be different. The first current sensing circuit 10 provides a first sensing signal 12 which is indicative of the first bidirectional current 11. The second current sensing circuit 20 provides a second sensing signal 22 which is indicative of the second bidirectional current 21. The first and the second sensing signal 12, 22 are received by a switching circuit 30. Further, a polarity signal 33 representative of a polarity of an input voltage (not shown in FIG. 1) of the power converter is received by the switching circuit 30. Based on the polarity signal 33, the first sensing signal 12 and the second sensing signal 22, the switching circuit 30 provides a first measurement signal 31.

Figure 2:
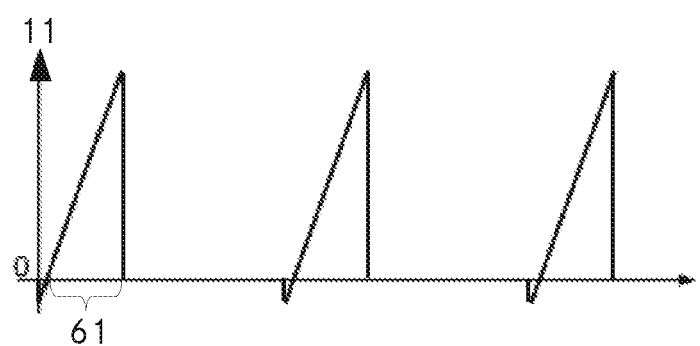
FIG. 2 an example of a first bidirectional current.

FIG. 2 shows an exemplary curve over time of the first bidirectional current 11 if the polarity signal 33 has a first value, i.e. corresponding for example with a positive input voltage of the power converter. First bidirectional current 11 may start at a small negative value and decreases linearly until it reaches zero. Thereafter, the first bidirectional current 11 continues without any delay to increase linearly until reaching a maximum value. Between the negative starting value of the first bidirectional current 11 and the positive maximum value there is a zero-crossing of the first bidirectional current 11. At the zero-crossing, the first bidirectional current 11 changes its direction. In absolute values, the positive maximum of the first bidirectional current 11 can be much larger than the negative starting point. Or in other words, the maximum current in a particular direction can be much smaller or larger than the maximum current in the opposite direction. After having reached its positive maximum, the first bidirectional current 11 may fall down to zero and remain there for a certain period of time. Then, the first bidirectional current 11 changes the direction to jump towards a negative maximum value. This change of the direction of the current is not considered a zero-crossing as the current does not cross the zero line at a specific moment of time but remains zero for a certain period of time.

If the polarity of the input voltage of the power converter changes, i.e. the polarity signal 33 assumes a second value, for example corresponding with a negative input voltage of the power converter, then FIG. 2 shows also an example of the second bidirectional current 21.

Figure 3:
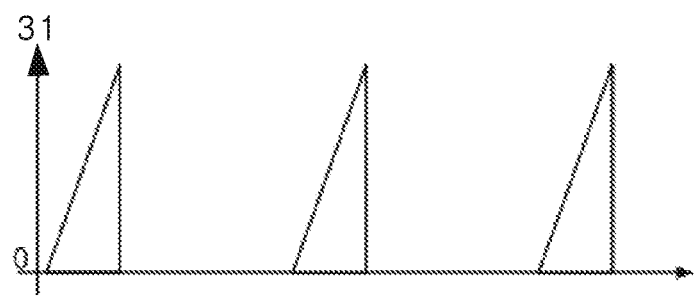
FIG. 3 an example of a first measurement signal.

FIG. 3 shows an exemplary curve over time of the first measurement signal 31 based on the first bidirectional current 11 as shown in FIG. 2, if the polarity signal 33 has a first value, i.e. corresponding for example with a positive input voltage of the power converter. The first measurement signal 31 is indicative of the first bidirectional current 11 only when the latter is flowing in a particular direction. If the first bidirectional current 11 flows in the opposite direction, the first measurement signal 31 remains zero.

If the polarity of the input voltage changes, i.e. the polarity signal 33 assumes a second value, for example corresponding with a negative input voltage of the power converter, then the first measurement signal 31 is indicative of the second bidirectional current 21, however, only when the latter is flowing in a particular direction. If the second bidirectional current 21 flows in the opposite direction, the first measurement signal 31 remains zero.

To summarize, depending on the polarity signal 33, the first measurement signal 31 is indicative of the first bidirectional current 11 or the second bidirectional current 21, as long as the bidirectional currents 11, 21 flow in one particular direction, while the first measurement signal 31 remains zero, if the bidirectional currents 11, 21 flow in the opposite direction.

Figure 4:
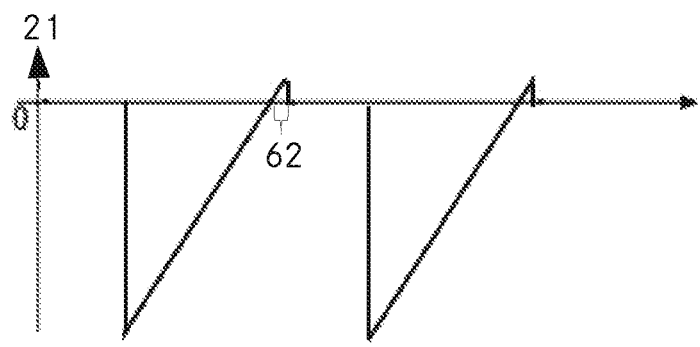
FIG. 4 an example of a second bidirectional current.

FIG. 4 shows an exemplary curve over time of the second bidirectional current 21 if the polarity signal 33 has a first value, i.e. corresponding for example with a positive input voltage of the power converter. Second bidirectional current 21 may start at a zero value before assuming a maximum negative value. Therefrom, second bidirectional current 21 decreases linearly until it reaches zero. Thereafter, the second bidirectional current 21 continues without any delay to increase linearly until reaching a maximum value. Between the negative starting value of the second bidirectional current 21 and the positive maximum value, there is a zero-crossing of the second bidirectional current 21. At the zero-crossing, the second bidirectional current 21 changes its direction. In absolute values, the negative maximum of the second bidirectional current 21 can be much larger than the positive ending point. Or in other words, the maximum current in a particular direction can be much smaller or larger than the maximum current in the opposite direction. After having reached its positive maximum, the second bidirectional current 21 may fall down to zero and remain there for a certain period of time. Then, the second bidirectional current 21 changes the direction to assume again a negative maximum value. This change of the direction of the bidirectional current is not considered a zero-crossing as the current does not cross the zero line at a specific moment of time but remains zero for a certain period of time.

If the polarity of the input voltage changes, i.e. the polarity signal 33 assumes a second value, for example corresponding with a negative input voltage of the power converter, then FIG. 4 shows also an example of the first bidirectional current 11.

Figure 5:
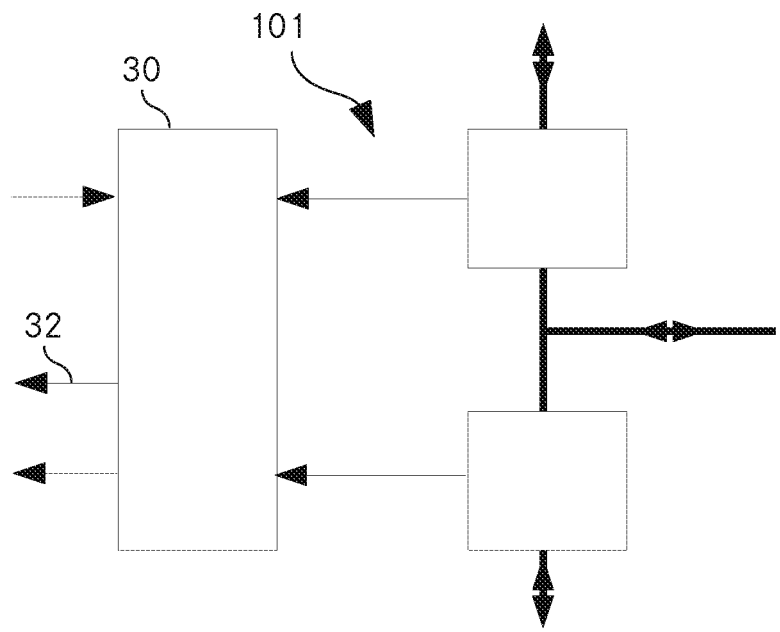
FIG. 5 a block diagram of a second embodiment of the invention.

FIG. 5 shows a block diagram of a second embodiment of the invention. The measurement circuit 101 is identical to measurement circuit 1 of FIG. 1 except for switching circuit 30 providing a second measurement signal 32. For ease of depiction, reference numbers have not repeated from FIG. 1, except for those reference numbers mentioned above.

Figure 6:
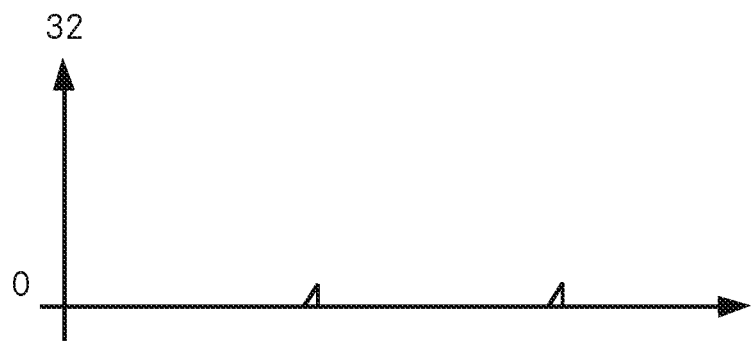
FIG. 6 an example of a second measurement signal.

FIG. 6 shows an exemplary curve over time of the second measurement signal 32 based on the second bidirectional current 21 as shown in FIG. 4, if the polarity signal 33 has a first value, for example corresponding with a positive input voltage of the power converter. The second measurement signal 32 is indicative of the second bidirectional current 21 only when the latter is flowing in a particular direction. If the second bidirectional current 21 flows in the opposite direction, the second measurement signal 32 remains zero.

If the polarity of the input voltage changes, i.e. the polarity signal 33 assumes a second value, for example corresponding with a negative input voltage of the power converter, then the second measurement signal 32 is indicative of the first bidirectional current 11, however, only when the latter is flowing in a particular direction. If the first bidirectional current 11 flows in the opposite direction, the second measurement signal 32 remains zero.

To summarize, depending on the polarity signal 33, the second measurement signal 32 is indicative of the second bidirectional current 21 or the first bidirectional current 11, as long as the bidirectional currents flow in one particular direction, while the second measurement signal 32 remains zero, if the bidirectional currents flow in the opposite direction.

Figure 7:
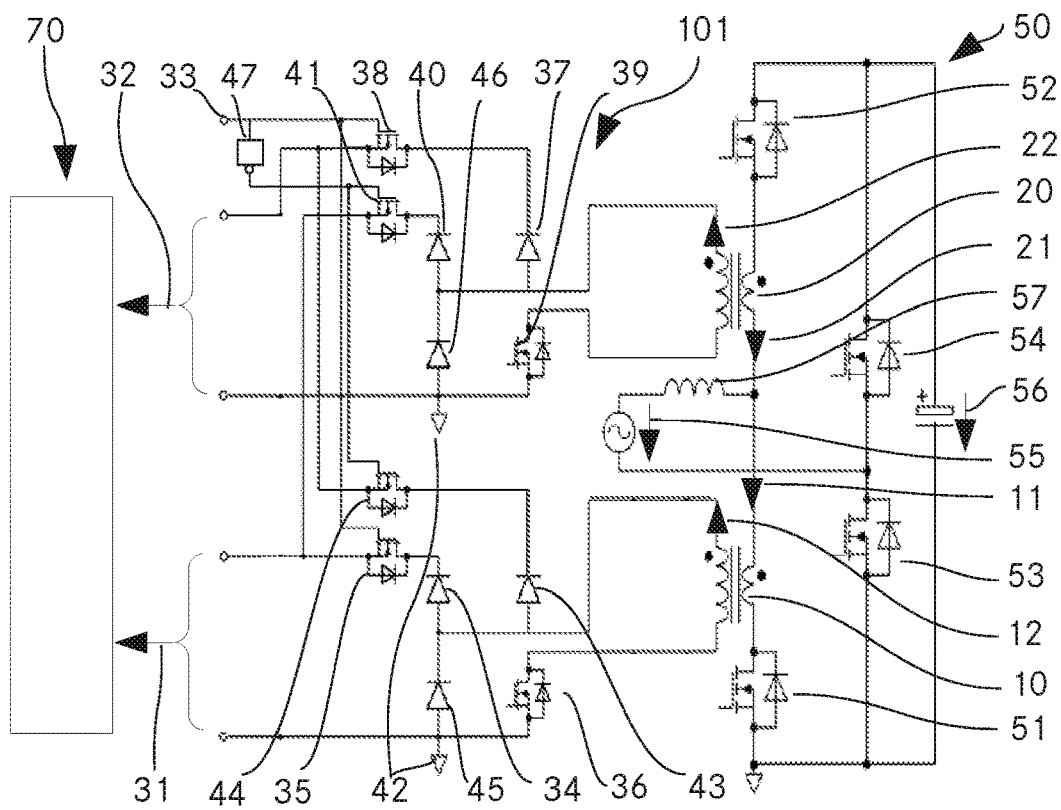
FIG. 7 a detailed circuit diagram of the second embodiment.

FIG. 7 shows a detailed circuit diagram of the second embodiment of the invention together with a power converter 50 and a controller 70.

In this example, the power converter 50 is a bridgeless totem pole power converter comprising a first power switch 51, a second power switch 52, a third power switch 53 and a fourth power switch 54. First and second power switch 51, 52 are switched with a frequency between 15 KHz and 300 KHz, in particular between 65 KHz and 75 KHz. Third and fourth power switch 53, 54 are switched with the AC input voltage, for example 50 Hz or 60 Hz. During a first half wave of the AC input voltage 55, for example during the positive half wave, power switch 53 may be turned on to be conductive and power switch 54 may be turned off to be non-conductive. During the second half wave of the AC input voltage 55, power switch 53 may be turned off to be non-conductive and power switch 54 may be turned on to be conductive.

In case of a power converter with a rectifier bridge, third and fourth power switch 53, 54 can be omitted, as they are replaced by diodes of the bridge rectifier. However, using a bridge rectifier might result in a loss of efficiency of the power converter wherefore the bridgeless power converter is preferable.

For the following explanation it is assumed that the AC input voltage 55 is positive, i.e. power switch 53 is turned on and conductive while power switch 54 is turned off and non-conductive.

A first time interval 61, shown in FIG. 2, starts upon a zero-crossing of the first bidirectional current 11. The first bidirectional current 11 flows from the AC input voltage source having an AC Input voltage 55 through inductor 57, first current sensing circuit 10, first power switch 51, and third power switch 53 back to the AC input voltage source. First bidirectional current 11 increases linearly as shown in FIG. 2. The first time interval ends upon turning off power switch 51, when first bidirectional current 11 becomes zero instantly. The current through the inductor 57 commutates in a path comprising a second current sensing circuit 20, a second power switch 52, a load having a DC output voltage 56 and third power switch 53. Thus, the second bidirectional current 21 jumps from zero to a negative maximum from where it linearly decreases towards zero, as illustrated in FIG. 4. Second bidirectional current 21 crosses zero which initiates a second time interval 62 as also shown in FIG. 4. Second bidirectional current 21 linearly increases through the same path as before. The second time interval 62 ends when the second power switch 52 is turned off. The second bidirectional current 21 becomes zero, instantly, as shown in FIG. 4. The current through the inductor 57 commutates in a path comprising the first current sensing circuit 10, the first power switch 51, and the third power switch 53. In particular, the diode of the first power switch 51 is conducting. First bidirectional current 11 is decreasing linearly from the negative maximum towards zero, as shown in FIG. 2. During this time, the voltage across first power switch 51 has become essentially zero and first power switch 51 is turned on. After the zero crossing of the first bidirectional current 11, the first time interval 61 will start again. A new switching cycle of the power converter 50 with principally the same current curves and time intervals will begin again.

Figure 8:
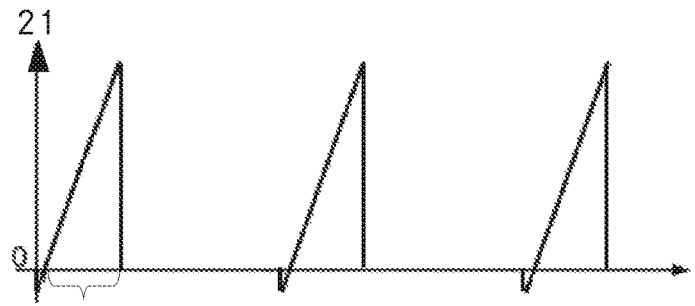
FIG. 8 another example of a second bidirectional current
Figure 9:
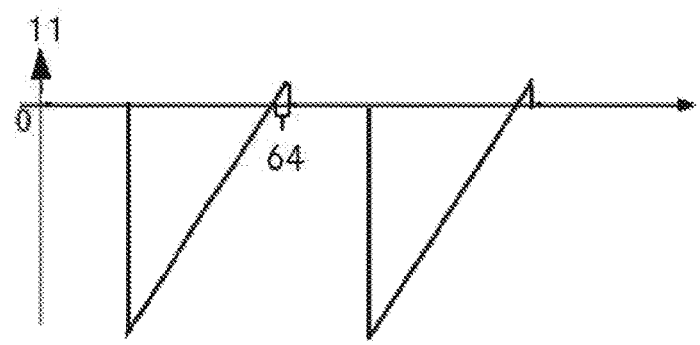
FIG. 9 another example of a first bidirectional current.

When the AC input voltage 55 changes its polarity and becomes negative, third power switch 53 is turned off and fourth power switch 54 is turned on. A third time interval 63 shown in FIG. 8 starts upon a zero-crossing of the second bidirectional current 21. The second bidirectional current 21 flows from the AC input voltage source having an AC-input voltage 55 through the fourth power switch 54, the second power switch 52, the second current sensing circuit 20 and the inductor 57 back to the AC input voltage source. The second bidirectional current 21 follows the same curve as the first bidirectional current 11 did when the AC input voltage was positive, see FIG. 2. The third time interval ends upon turning off second power switch 52. As a result, second bidirectional current 21 becomes zero, instantly. The current through the inductor 57 commutates in a path comprising the fourth power switch 54, the load having a DC output voltage 56, the first power switch 51, the first current sensing circuit 10, and the inductor 57 back to the AC input voltage source. Thus, the first bidirectional current 11 jumps from zero to a negative maximum from where it linearly decreases towards zero as shown in FIG. 9. The first bidirectional current 11 follows the same curve as the second bidirectional current 21 did when the AC input voltage was positive, see FIG. 4. First bidirectional current 11 crosses zero which initiates a fourth time interval 64 as shown in FIG. 9. First bidirectional current 11 linearly increases through the same path as before. The fourth time interval 64 ends when the first power switch 51 is turned off. The first bidirectional current 11 becomes zero, instantly. The current through the inductor 57 commutates in a path comprising the second current sensing circuit 20, the second power switch 52, and the fourth power switch 54. In particular, the diode of the second power switch 52 is conducting. Second bidirectional current 21 is decreasing linearly from the negative maximum towards zero. During this time, the voltage across the second power switch 52 has become essentially zero and the second power switch 52 is turned on. After the zero crossing of the second bidirectional current 52, the third time interval 63 will start again. A new switching cycle of the power converter 50 with principally the same current curves and time intervals will begin again.

To summarize, the curve of first bidirectional current 11 during the positive half wave of the AC input voltage 55 is basically equal to the curve of the second bidirectional current 21 during the negative half wave of the AC input voltage 55. Similarly, the curve of the second bidirectional current 21 during the positive half wave of the AC input voltage 55 is basically equal to the curve of the first bidirectional current 11 during the negative half wave of the AC input voltage 55. The first time interval 61 during the positive half wave of the AC input voltage 55 corresponds with the third time interval 63 during the negative half wave of the AC-input voltage 55, while the second time interval 62 during the positive half wave of the AC input voltage 55 corresponds with the fourth time interval 64 during the negative half wave of the AC input voltage 55.

After having explained the working principle of an exemplary power converter 50, the following explanation will be dedicated to the current measurement circuit 101.

In the embodiment shown in FIG. 7, the current sensing circuits 10, 20 are realized in form of current transformers. Each current transformer delivers a sensing signal in form of a current.

During the first time interval 61, the first sensing signal 12 is directed via the first diode 34, first switch 35 and second switch 36 to form first measurement signal 31. During the second time interval 62, the second sensing signal 22 is directed via the second diode 37, third switch 38 and fourth switch 39 to form second measurement signal 32. During the third time interval 63, second sensing signal 22 is directed via third diode 40, fifth switch 41, ground 42 and fourth switch 39 to form first measurement signal 31. During the fourth time interval 64, first sensing signal 12 is directed via fourth diode 43, sixth switch 44, ground 42 and second switch 36 to form second measurement signal 32.

During times other than the above mentioned time intervals, when the first sensing signal 12 or the second sensing signal 22 have another direction than mentioned above, the sensing signals will be directed to the fifth diode 45 or sixth diode 46, respectively, and thereby shorting the respective secondary winding of the current transformer, resulting in the respective measurement signal 31, 32 being zero.

In embodiments with a current transformer, second switch 36 and/or fourth switch 39 might be needed to reset the current transformer in order to prevent the current transformer from saturation. In particular, second switch 36 and/or fourth switch 39 might be needed if the power converter is intended to be operated in TCM modulation of a PFC.

In each applicable embodiment, regardless of any other feature or features thereof, the switching circuit 30 is adapted to use the polarity signal 33 to turn on the first and third switch 35, 38 during a positive AC input voltage 55. Current measurement circuit 1 comprises an inverter 47 to turn off fifth and sixth switch 41, 44 during this time. During the negative half wave of the AC input voltage 55, the switching circuit 30 is adapted to use the polarity signal 33 to turn off the first and third switch 35, 38 and to turn on, via the inverter 47, fifth and sixth switch 41, 44.

In embodiments devoid of a second measurement signal 32, the second diode 37, the third switch 38, the fourth diode 43, and the sixth switch 44 can be omitted.

Controller 70 receives the first and second measurement signal 31, 32 to control the switching of the power switches 51, 52, 53, and 54 as mentioned above.

Figure 10:
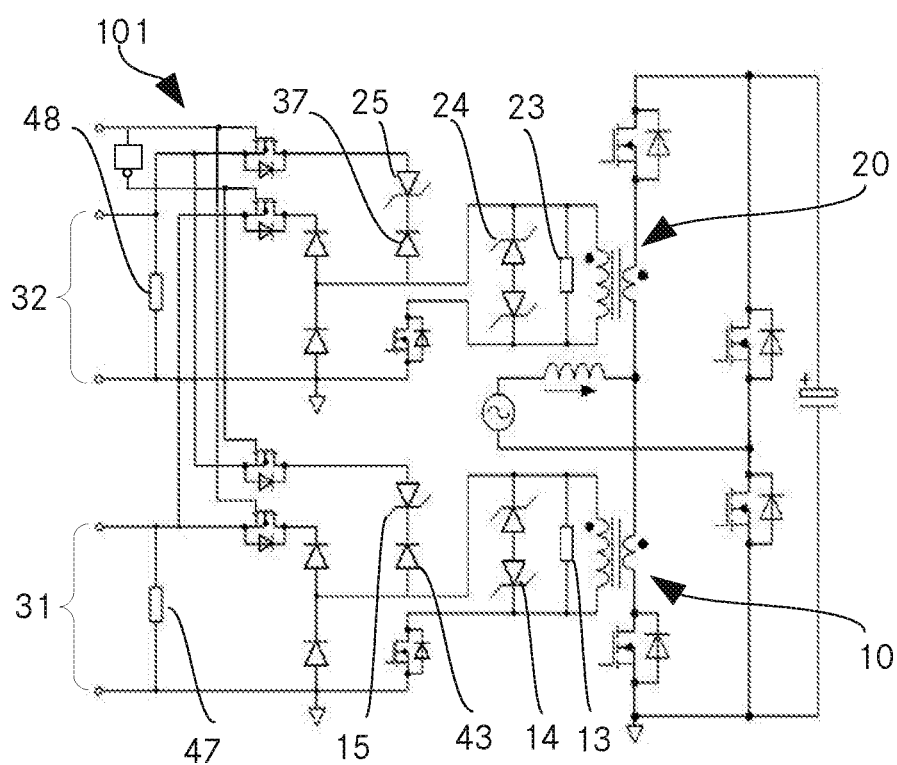
FIG. 10 a detailed circuit diagram of an embodiment having the features of several different embodiments.

FIG. 10 shows a detailed circuit diagram of an embodiment of the invention having the features of several different embodiments. For ease of understanding, only the additional features not shown so far and features in direct context thereto are depicted with reference numbers. All other features are not explicitly marked with numbers.

In embodiments with a current transformer, the first sensing circuit 10 and/or the second current sensing circuit 20 may further comprise a first resistor 13 and/or a second resistor 23. The advantage thereof is that the resistors can be used to reset the current transformer and prevent it from saturation.

In embodiments with current transformer, the first sensing circuit 10 and/or the second current sensing circuit 20 may further comprise first back-to-back z-diodes 14 and/or second back-to-back z-diodes 24. The advantage thereof is that the back-to-back z-diodes can be used to reset the current transformer and prevent it from saturation by providing a voltage such as to de-commutate the current through the current transformer.

In another different embodiment, the switching circuit 101 comprises a first and second z-diode 15, 25. First and second z-diode 15, 25 are in series with and back-to-back to fourth and second diode 43, 37, respectively. The advantage thereof is that a current transformer if used as a current sensing device is prevented from being saturated.

In another different embodiment the switching circuit 101 further comprises a first and/or a second shunt resistor 47, 48. When the first or the second sensing signal 12, 22 are directed through the first or second shunt resistor 47, 48, the voltage across the first and second shunt resistor 47, 48 will form the first and second measurement signal 31, 32, respectively. The advantage thereof is that measurement signals corresponding to a voltage can be easily used by the controller.

In summary, it is to be noted that the invention provides several advantages over the prior art, such as real time current measurement for over-current protection, scalability of the measurement ranges for a precise control of the power converter (in particular for a precise closed loop current control of the converter), analog signal switching for high switching frequencies of the power converter, unidirectional or unipolar measurement signal for direct connection with analog-digital converters, galvanic isolation of sensing signals for safe operation, and the use of simple and small current transformers for cost-effective implementation.

Unless explicitly excluded, the features of the different embodiments can be combined to form further embodiments which are for ease of understanding not all explained or mentioned within this patent application.

The invention claimed is:

1. Current measurement circuit for providing a measurement signal for a controller for controlling a switching of power switches of a power converter, comprising
   a) a first current sensing circuit for sensing a first bidirectional current representative of a current through a first power switch of the power converter, the first current sensing circuit being adapted to provide a first sensing signal indicative of the first bidirectional current;
   b) a second current sensing circuit for sensing a second bidirectional current representative of a current through a second power switch of the power converter, the second current sensing circuit being adapted to provide a second sensing signal indicative of the second bidirectional current; and
   c) a switching circuit being adapted to provide a first measurement signal based on the first sensing signal, the second sensing signal and a polarity signal representative of a polarity of an input voltage of the power converter, wherein the first measurement signal is indicative of the first bidirectional current during a first time interval starting at a zero-crossing of the first bidirectional current and ending at switching off of the first power switch, and indicative of the second bidirectional current during a third time interval starting at a zero-crossing of the second bidirectional current and ending at switching off of the second power switch, wherein during other time intervals when the first sensing signal or the second sensing signal have another direction different from the first bidirectional current or second bidirectional current, the first sensing signal or the second sensing signal will be redirected such that the secondary winding of the current transformer is shorted.

2. Current measurement circuit according to claim 1, wherein the first and the second sensing signals are galvanically isolated from the first and the second power switches, wherein the first current sensing circuit is a first current transformer having a first primary winding connected in series with the first power switch for conducting the first bidirectional current and a first secondary winding for delivering the first sensing signal, and wherein the second current sensing circuit is a second current transformer having a second primary winding connected in series with the second power switch for conducting the second bidirectional current and a second secondary winding for delivering the second sensing signal.

3. Current measurement circuit according to claim 1, wherein the first measurement signal is proportional to the first bidirectional current during the first time interval and proportional to the second bidirectional current during the third time interval.

4. Current measurement circuit according to claim 1, wherein if the polarity signal has a first value, the switching circuit is adapted to start the first time interval when the first bidirectional current has a zero-crossing and to end the first time interval when the first power switch is turned off, and if the polarity signal has a second value, the switching circuit is adapted to start the third time interval when the second bidirectional current has a zero-crossing and to end the third time interval when the second power switch is turned off.

5. Current measurement circuit according to claim 1, wherein the switching circuit is adapted to provide a second measurement signal based on the first sensing signal, the second sensing signal and the polarity signal representative of the polarity of the input voltage of the power converter, and the second measurement signal is indicative of the second bidirectional current during a second time interval and indicative of the first bidirectional current during a fourth time interval.

6. Current measurement circuit according to claim 5, wherein the second measurement signal is proportional to the second bidirectional current during a second time interval and proportional to the first bidirectional current during a fourth time interval.

7. Current measurement circuit according to claim 5, wherein if the polarity signal has a first value, the switching circuit is adapted to start the second time interval when the second bidirectional current has a zero-crossing and to end the second time interval when the second power switch is turned off, and if the polarity signal has a second value, the switching circuit is adapted to start the fourth time interval when the first bidirectional current has a zero-crossing and to end the fourth time interval when the first power switch is turned off.

8. Current measurement circuit according to claim 1, wherein each measurement signal is a unidirectional signal.

9. Current measurement circuit according to claim 1, wherein each measurement signal is an analog signal.

10. Current measurement circuit according to claim 1, further comprising a shunt resistor per measurement signal, wherein each measurement signal corresponds to a voltage across the respective shunt resistor.

11. Current measurement circuit according to claim 1, wherein the switching circuit comprises diodes and transistors only.

12. A control arrangement system for a power converter having power switches, comprising a current measurement circuit including:
 a) a first current sensing circuit for sensing a first bidirectional current representative of a current through a first power switch of the power converter, the first current sensing circuit being adapted to provide a first sensing signal indicative of the first bidirectional current;
 b) a second current sensing circuit for sensing a second bidirectional current representative of a current through a second power switch of the power converter, the second current sensing circuit being adapted to provide a second sensing signal indicative of the second bidirectional current; and
 c) a switching circuit being adapted to provide a first measurement signal based on the first sensing signal, the second sensing signal and a polarity signal representative of a polarity of an input voltage of the power converter, wherein the first measurement signal is indicative of the first bidirectional current during a first time interval starting at a zero-crossing of the first bidirectional current and ending at switching off of the first power switch, and indicative of the second bidirectional current during a third time interval starting at a zero-crossing of the second bidirectional current and ending at switching off of the second power switch, and a power factor controller for controlling a switching of the power switches of the power converter, wherein during other time intervals when the first sensing signal or the second sensing signal have another direction different from the first bidirectional current or second bidirectional current, the first sensing signal or the second sensing signal will be redirected such that the secondary winding of the current transformer is shorted.

13. The control arrangement system according to claim 12, wherein the power factor controller is a triangular current mode power factor controller.

14. An AC-DC Power converter having power switches comprising: a current measurement circuit including:
 a) a first current sensing circuit for sensing a first bidirectional current representative of a current through a first power switch of the power converter, the first current sensing circuit being adapted to provide a first sensing signal indicative of the first bidirectional current;
 b) a second current sensing circuit for sensing a second bidirectional current representative of a current through a second power switch of the power converter, the second current sensing circuit being adapted to provide a second sensing signal indicative of the second bidirectional current; and
 c) a switching circuit being adapted to provide a first measurement signal based on the first sensing signal, the second sensing signal and a polarity signal representative of a polarity of an input voltage of the power converter, wherein the first measurement signal is indicative of the first bidirectional current during a first time interval starting at a zero-crossing of the first bidirectional current and ending at switching off of the first power switch, and indicative of the second bidirectional current during a third time interval starting at a zero-crossing of the second bidirectional current and ending at switching off of the second power switch, wherein during other time intervals when the first sensing signal or the second sensing signal have another direction different from the first bidirectional current or second bidirectional current, the first sensing signal or the second sensing signal will be redirected such that the secondary winding of the current transformer is shorted, and a triangular current mode power factor controller for controlling a switching of the power switches of the AC-DC power converter.

15. Method for providing a measurement signal for a controller for controlling a switching of power switches of a power converter, comprising the steps of
a) providing a first sensing signal by sensing a first bidirectional current representative of a current through a first power switch of the power converter;
b) providing a second sensing signal by sensing a second bidirectional current representative of a current through a second power switch of the power converter; and
c) providing a first measurement signal based on the first sensing signal, the second sensing signal and a polarity signal representative of a polarity of an input voltage of the power converter, wherein the first measurement signal is indicative of the first bidirectional current during a first time interval starting at a zero-crossing of the first bidirectional current and ending at switching off of the first power switch, and indicative of the second bidirectional current during a third time interval starting at a zero-crossing of the second bidirectional current and ending at switching off of the second power switch, wherein during other time intervals when the first sensing signal or the second sensing signal have another direction different from the first bidirectional current or second bidirectional current, the first sensing signal or the second sensing signal will be redirected such that the secondary winding of the current transformer is shorted.

16. Method according to claim 14, further comprising the step of providing a second measurement signal based on the first sensing signal, the second sensing signal and the polarity signal representative of the polarity of the input voltage of the power converter, wherein the second measurement signal is indicative of the second bidirectional current during a second time interval and indicative of the first bidirectional current during a fourth time interval.

17. The current measurement circuit according to claim 5, wherein the first power switch and the second power switch are switched with a frequency between 15 KHz (Kilohertz) and 300 KHz.

18. The current measurement circuit according to claim 12, wherein the first power switch and the second power switch are switched with a frequency between 15 KHz (Kilohertz) and 300 KHz.

19. The current measurement circuit according to claim 14, wherein the first power switch and the second power switch are switched with a frequency between 15 KHz (Kilohertz) and 300 KHz.

* * * * *